US012578379B2

(12) United States Patent
Sobolewski

(10) Patent No.: US 12,578,379 B2
(45) Date of Patent: Mar. 17, 2026

(54) UNIFIED MEASUREMENT SYSTEM FOR STATIC AND DYNAMIC CHARACTERIZATION OF A DEVICE UNDER TEST

(71) Applicant: Keithley Instruments, LLC, Solon, OH (US)

(72) Inventor: Gregory Sobolewski, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 169 days.

(21) Appl. No.: 18/626,190

(22) Filed: Apr. 3, 2024

(65) Prior Publication Data

US 2024/0248131 A1 Jul. 25, 2024

Related U.S. Application Data

(63) Continuation-in-part of application No. 17/688,733, filed on Mar. 7, 2022.

(Continued)

(51) Int. Cl.
*G01R 31/26* (2020.01)
*G01R 31/28* (2006.01)

(52) U.S. Cl.
CPC ..... *G01R 31/2837* (2013.01); *G01R 31/2621* (2013.01); *G01R 31/2844* (2013.01)

(58) Field of Classification Search
CPC ............ G01R 31/2601; G01R 31/2621; G01R 31/2837; G01R 31/2844
See application file for complete search history.

(56) References Cited

U.S. PATENT DOCUMENTS 3,979,672 A 9/1976 Arnoldi
7,193,469 B2 * 3/2007 Kaya ...................... H03F 3/217
330/277

(Continued)

FOREIGN PATENT DOCUMENTS

CN 108051719 A 5/2018
CN 212410779 U 1/2021
CN 116577551 A 8/2023

OTHER PUBLICATIONS

Berning et al., "Generalized Test Bed for High-Voltage, High-Power SiC Device Characterization" Conference Record of the 2006 IEEE Industry Applications Conference Forty-First IAS Annual Meeting (Year: 2006).

(Continued)

*Primary Examiner* — Thang X Le
(74) *Attorney, Agent, or Firm* — Miller Nash LLP; Krista Y. Chan

(57) ABSTRACT

A test and measurement system includes a device under test (DUT) interface structured to couple to first and second DUTs that are coupled to form a half bridge circuit. A characterization circuit is controlled to perform static testing and dynamic testing of the first and second DUTs. The characterization circuit includes a solid-state bias tee including the first DUT and a first drive voltage generator that provides a DC pulse signal and AC signal on a gate node of the first DUT to cause the first DUT to supply current and voltage signals to the second DUT for static and dynamic characterization of the second DUT. One characterization circuit can generate, at the same time, the gate charge characterization parameters for one DUT and reverse current path (e.g., body diode) characterization of another DUT.

20 Claims, 8 Drawing Sheets

Related U.S. Application Data

(60) Provisional application No. 63/161,382, filed on Mar. 15, 2021, provisional application No. 63/260,513, filed on Aug. 23, 2021, provisional application No. 63/458,075, filed on Apr. 7, 2023, provisional application No. 63/464,143, filed on May 4, 2023, provisional application No. 63/523,836, filed on Jun. 28, 2023.

(56) References Cited

U.S. PATENT DOCUMENTS

| | | |
|---|---|---|
| 7,755,379 B2 | 7/2010 | Lui et al. |
| 8,188,767 B2 | 5/2012 | Fish et al. |
| 9,000,785 B2 | 4/2015 | Charbuillet et al. |
| 9,097,759 B2 | 8/2015 | Keller et al. |
| 9,547,035 B2 | 1/2017 | Iwasaki et al. |
| 10,006,957 B2 | 6/2018 | Shang et al. |
| 10,640,003 B2 | 5/2020 | Lu et al. |
| 11,067,629 B2 | 7/2021 | Weimer |
| 11,733,328 B2 | 8/2023 | Tsai et al. |
| 11,740,278 B2 | 8/2023 | Roche et al. |

| | | | |
|---|---|---|---|
| 2011/0096445 A1* | 4/2011 | Truong | H02M 1/32 |
| | | | 361/18 |
| 2018/0354384 A1 | 12/2018 | Lu et al. | |
| 2019/0369167 A1 | 12/2019 | Bhat et al. | |
| 2020/0379043 A1 | 12/2020 | Weimer | |
| 2021/0033659 A1 | 2/2021 | Roche et al. | |
| 2022/0291278 A1 | 9/2022 | Sobolewski et al. | |
| 2022/0390502 A1 | 12/2022 | Li et al. | |
| 2024/0072649 A1* | 2/2024 | Chin | H02M 1/08 |
| 2025/0298068 A1* | 9/2025 | Kumar | G01R 31/2621 |

OTHER PUBLICATIONS

Ghosh et al., "Conceptual Design and Demonstration of an Automatic System for Extracting Switching Loss and Creating Data Library of Power Semiconductors" IEEE Open Journal of Power Electronics (vol. 1) 2020 (Year: 2020).

Machine Translation of CN-108051719-A, downloaded Mar. 2024 (Year: 2024).

Machine translation of CN-212410779-U, downloaded Mar. 2024 (Year: 2024).

* cited by examiner

UNIFIED MEASUREMENT SYSTEM FOR STATIC AND DYNAMIC CHARACTERIZATION OF A DEVICE UNDER TEST

RELATED APPLICATIONS

This application is a Continuation-in-Part application of U.S. Non-Provisional application Ser. No. 17/688,733, titled "UNIFIED MEASUREMENT SYSTEM FOR STATIC AND DYNAMIC CHARACTERIZATION OF A DEVICE UNDER TEST," filed Mar. 7, 2022, which, in turn, claims the benefit of U.S. Provisional Patent Application No. 63/161,382, titled "UNIFIED MEASUREMENT SYSTEM FOR STATIC AND DYNAMIC CHARACTERIZATION OF A DEVICE UNDER TEST," filed Mar. 15, 2021, and the benefit of U.S. Provisional Patent Application No. 63/260, 513, titled "HIGH POWER STATIC AND DYNAMIC DUT CHARACTERIZATION," filed Aug. 23, 2021. This application also claims the benefit of U.S. Provisional Patent Application No. 63/458,075, titled "IMPEDANCE MEASUREMENT OF A DEVICE UNDER TEST ON A COMBINED STATIC AND DYNAMIC CHARACTERIZATION PLATFORM," filed Apr. 7, 2023, the benefit of U.S. Provisional Patent Application No. 63/464,143, titled "BODY DIODE CHARACTERIZATION ON A UNIFIED MEASUREMENT SYSTEM FOR STATIC AND DYNAMIC CHARACTERIZATION OF A DEVICE UNDER TEST," filed May 4, 2023, and the benefit of U.S. Provisional Patent Application No. 63/523,836, titled "GATE CHARGE CHARACTERIZATION OF A DEVICE UNDER TEST ON A UNIFIED STATIC AND DYNAMIC TEST PLATFORM," filed Jun. 28, 2023. The disclosures of each of these applications are incorporated herein by reference in their entirety.

TECHNICAL FIELD

This disclosure relates to test and measurement systems, more particularly to systems and methods for performing static and dynamic characterization of devices.

BACKGROUND

Characterization of a device under test (DUT), for example semiconductor devices such as a silicon-carbide (SiC) metal-oxide-semiconductor field-effect transistor (MOSFET), may generally include both static characterization, such as current/voltage (I/V) curves, and dynamic characterization, such as switching parameters. Conventional static characterization involves use of a dedicated static measurement platform. Additionally, conventional dynamic characterization of a DUT involves a different measurement platform, in some cases a dedicated custom dynamic platform.

A further complication may arise regarding high power devices, such as FETs, because they undergo characterization with pulse signals due to the safe operating area (SOA) limitations. Moreover, traditional impedance characterization of FETs, such as MOSFETs, requires the use of separate static and dynamic characterization platforms. Dynamic characterization includes the measurement of impedances of FETs or other type of DUT being characterized, and this may involve the use of specialized circuits for dynamic characterization such as bias tees used to perform desired impedance measurements on the FET. A bias tee is a three-port device including a first input port receiving a direct current (DC) bias voltage and a second input port receiving an alternating or radio frequency (RF) signal. The first input port is inductively coupled to an output port and the second input port is capacitively coupled to the output port to provide an output signal having desired DC and RF components on the output port. The output ports of respective bias tees are coupled to the gate, drain, and source of the FET being characterized. These bias tees must be designed for specific voltage and frequency ranges and typically are formed by discrete inductive, capacitive, and resistive components, which complicates integration of the bias tees into the dynamic characterization platform. Moreover, the bias tees have current and frequency limitations that limit the impedance measurements that may be performed on the FET or other DUT being characterized.

Embodiments of the disclosed apparatus and methods address shortcomings in the prior art.

DETAILED DESCRIPTION

Figures 1, 2:
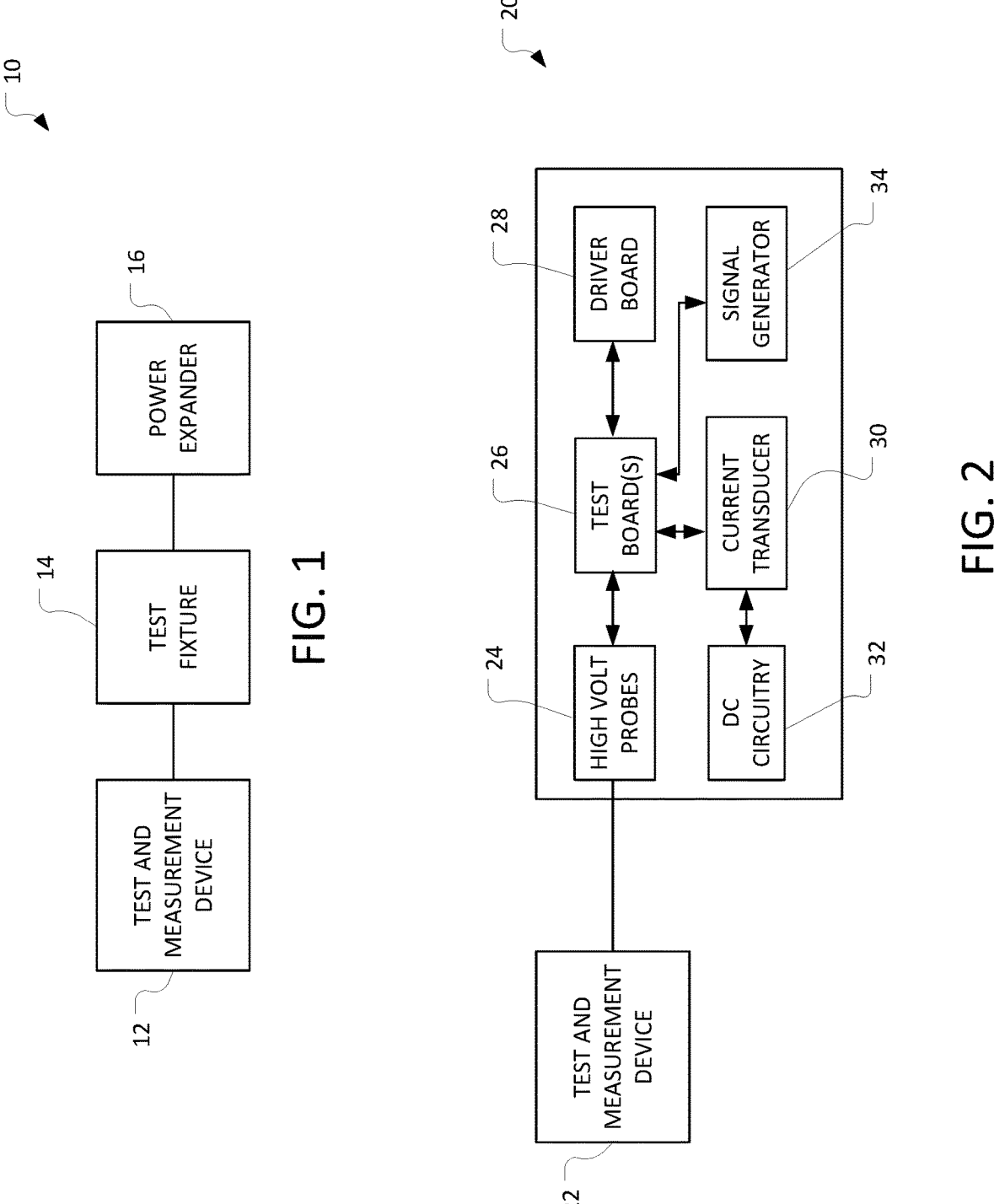
FIG. 1 shows an example of a conventional dedicated static characterization measurement platform.
FIG. 2 shows an example of a conventional dedicated dynamic characterization measurement platform.

Conventionally, high power characterization of devices under test (DUTs) typically involve a static measurement platform. FIG. 1 shows an example of such a platform 10. In this example, the platform includes a test and measurement device 12, a test fixture 14 to which one or more DUTs (not shown) is connected, and a power expander 16.

Performing dynamic power characterization requires a separate platform, which is a large floor model platform, or a custom platform. FIG. 2 shows an example of such a platform 20 that may include some or all of the components shown. A test and measurement device 22 may actually include one or more test and measurement devices, such as an oscilloscope and an impedance analyzer. The test and measurement device 22 connects to the test boards 26 and the DUT by high voltage probes 24. The test boards 26 may have a driver board 28, typically used to turn power switches on and OFF with stability and possibly provide power protection. DC circuity 32 may include DC-link capacitances, a DC voltage supply, and load inductors. A current transducer 30 and a signal generator 34 connect to the test boards to allow the boards to be tested.

Generally, characterizing the devices either statically or dynamically takes separate, large instrument and fixture platforms. The embodiments here provide a combined characterization system that has two components, an interactive test and measurement device such as an oscilloscope, impedance analyzer, combination of both, or one or more of many other test and measurement devices. For simplicity, this discussion will refer to this testing component as a test and measurement device. The other component is a power delivery and measurement front end with a DUT interface for mounting the test boards, which this disclosure may also refer to as the fixture. The embodiments here generally involve two separate components, but they could also be mounted into one housing.

As used here, the term "high voltage" refers to any voltage including and above 42 volts.

The embodiments here provide a dual-purpose characterization platform with several advantages. The system, meaning both the testing device and the fixture, is sized to allow transportation by one individual. The fixture encloses all the high voltage circuitry for safety and may have an interlock that prevents improper operation of high voltage systems that may result from faults in the system. The system simplifies setup in that the user only needs to put the DUT into the fixture. The two components in the system connect by a simple cable, so the system does not require re-cabling between various tests. Automated switching of the measurement configuration allows the user to obtain all the desired parameters for the tests. The fixture may also include heating and/or cooling equipment, and a protective barrier around the device in case of device damage.

Figure 3:
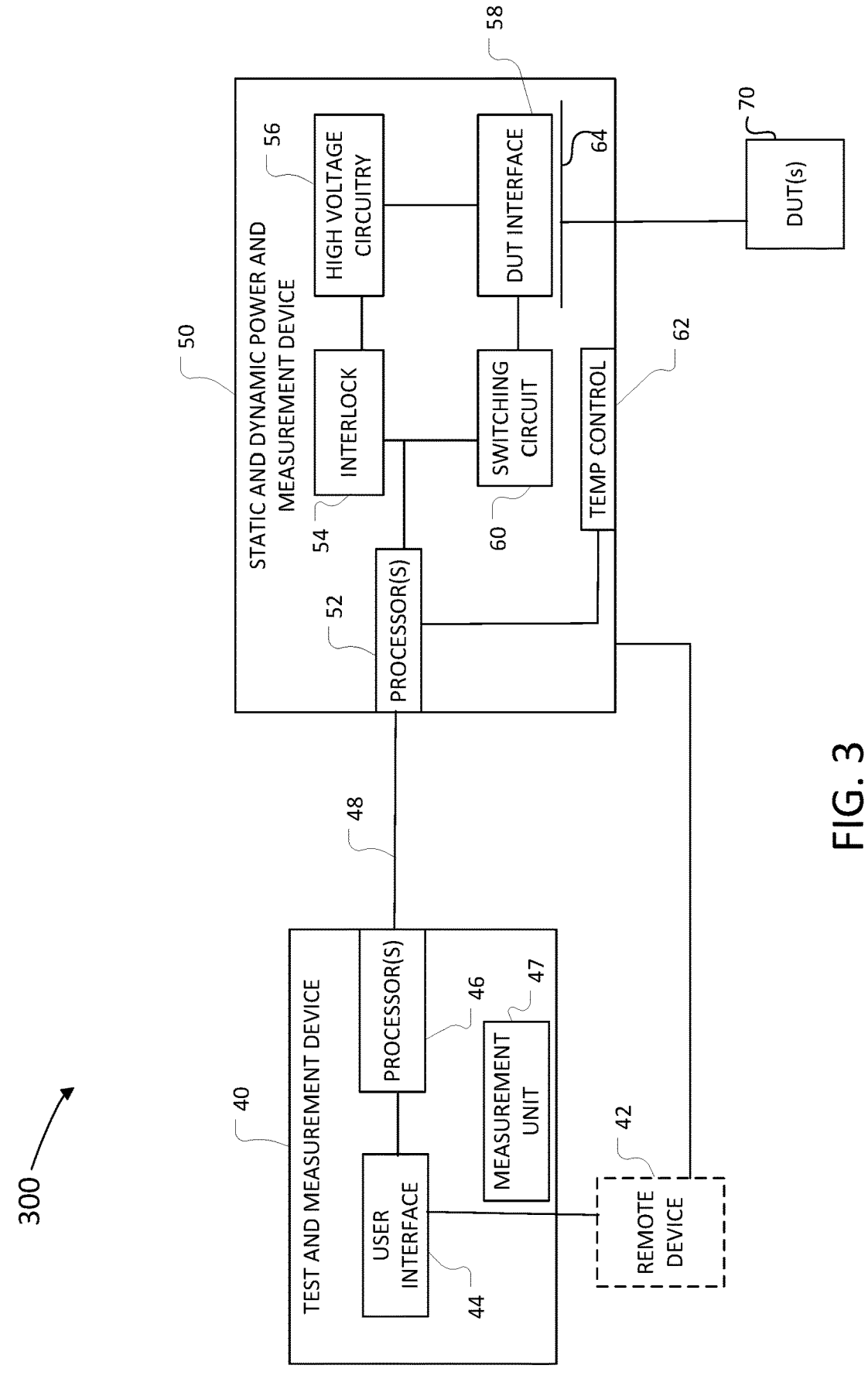
FIG. 3 shows an embodiment of a test and measurement system, according to embodiments of the disclosure.

FIG. 3 shows an embodiment of a test and measurement system 300, which may also be referred to as a platform, having a test and measurement device 40 such as an oscilloscope or other test and measurement device. For ease of discussion, the device 40 may be referred to as a measurement device. The other part of the system is a static and dynamic power and measurement device 50, which will be referred to as a power device for ease of discussion. These terms are not intended to limit the capabilities of either device, so no such limitation should be implied.

The measurement device 40 may have many different components, including a user interface 44 that allows a user to interact with various menus. The user interface 44 allows the user to make selections as to the tests to be run, set parameters, etc., such as through a display having a touch screen or various buttons and knobs. The measurement device 40 has one or more processors 46 that receive the user inputs and send the parameters and other selections to the measurement device, and may receive output from the power device 50 and generate outputs for the user from the data. The measurement device 40 includes a measurement unit 47 that performs tests and measures parameters of a DUT. A remote device 42, such as a computing device such as a personal computing device or smart phone, may also access the test and measurement platform 300 for remote operation, either through the measurement device 40 or the power device 50. The term "processor" as used here means any electronic component that can receive an instruction and perform an action, such as microcontrollers, field programmable gate arrays (FPGA), and application-specific integrated circuits (ASIC), as will be discussed in more detail below.

The measurement device 40 communicates with the power device 50 through a direct connection 48, such as a cable. The two devices 40, 50, and the direct connection 48, are configured to be portable, transportable by one individual. The direct connection 48 connects to each device through connection circuitry (not shown) that allows the devices 40, 50 to switch test configurations without having to re-cable.

The power device 50 may also have several different elements. These may include one or more processors 52, high voltage circuitry 56 that provides high voltage to one or more device under test (DUT(s)) 70, and an interlock 54 that acts as protection for the high voltage circuity. The DUT(s) 70 may include one or more separate DUTs, depending on a test configuration of the measurement device 40 and power device 50. The interlock 54 is designed to prevent device damage for any dangerous conditions resulting from the high voltage produced by the high voltage circuitry 56. The DUT(s) 70 mounts to a DUT interface 58, which may be a universal DUT interface to which the DUT is mounted and that allows the DUT(s) 70 to connect to the various components in the power device 50.

Operation of the high voltage circuitry 56 as well as the operation of the DUT(s) 70 may generate heat, and/or the DUT(s) 70 may need a particular temperature range to operate. The power device 50 accordingly may include temperature control circuitry 62 to control the temperature of the DUT(s) 70. The one or more processors 52 monitor the temperature and operate the temperature control 62 which may comprise items such as fans, switchable heat sinks, cooling systems, heaters, etc. The power device 50 may also include a barrier 64 to protect the power device 50 from damage by the DUT(s) 70. The power device 50 may also include a switching circuit 60, which controls operation of various components within the power device 50 to test and measure characteristics of the DUT(s) 70.

Generally, in operation, the user supplies an input through the user interface 44, remotely or directly, to control operation of the power device 50 to characterize the DUT(s) 70 either statically or dynamically. Typically, dynamic characterization is accomplished using a half bridge circuit such as in the characterization circuit 400 in the embodiment shown in FIG. 4. In general, the characterization circuit 400 is housed within the power device 50, and more specifically within the switching circuit 60, although embodiments of the disclosure are not limited to such an example.

The characterization circuit 400 includes a half bridge circuit formed by two DUTs DUT_top and DUT_bot, which correspond to the DUT(s) 70 illustrated in the test and measurement system 300 of FIG. 3. The DUT DUT_top may be referred to as the top device DUT_top and the DUT DUT_bot referred to as the bottom device DUT_bot in the present description. One method of performing dynamic characterization, referred to here as the double pulse method, uses a half bridge circuit. The double pulse method or "double pulse testing" is discussed in more detail below with reference to FIG. 6. In the characterization circuit 400, the top device DUT_top and bottom device DUT_bot of the half bridge circuit are coupled in series between a supply voltage node and reference voltage node. Each of the devices DUT_bot, DUT_top is a field-effect transistor (FET) in the example embodiment of FIG. 4, and more specifically an N-channel MOSFET.

In general operation, the bottom device DUT_bot is turned ON to obtain a desired current through a test inductor Test_L. Subsequently, the bottom device DUT_bot is turned OFF and the top device DUT_top is turned ON, which circulates the inductor current from the Test_L inductor through the top device DUT_top. Alternatively, the top device DUT_top may be replaced by a diode if only one DUT(s) 70 is being tested. After a specified time that depends upon characteristics of the top and bottom devices DUT_top, DUT_bot, the top device DUT_top is turned OFF, and the bottom device DUT_bot is again turned ON. Desired data to test and characterize the top and bottom devices DUT_top, DUT_bot may be collected during these transitions and operation of the top and bottom devices DUT_top, DUT_bot, and energy losses may be calculated. This same platform, depending upon the control of voltages and currents through the devices DUTs DUT_top, DUT_bot, can be used to extract static parameters.

Replacing the top device DUT_top with a diode or a short allows gate control of the bottom device DUT_bot which, in turn, allows extraction of static current-voltage (I/V) curves. With the top device DUT_top available or present, additional methods of extracting static data can be used. These may include independent gate/drain pulsing of potentials at the bottom device DUT_bot. To do so, the system would control the voltage at the gate of the bottom device DUT_bot to allow proper transfer characteristics measurements of the device. Static I/V device characterizations do not need the test inductor Test_L, but the inclusion or presence of the test inductor Test_L allows the same circuit to perform both static and dynamic characterizations. If both top and bottom devices DUT_top, DUT_bot are present in the characterization circuit 200, and are the same types of device, the maximum power would be split between the top and bottom devices DUT_top, DUT_bot. If a full power test of one of the devices DUT_top, DUT_bot is desired, the other device would be replaced with a short.

Figure 4:
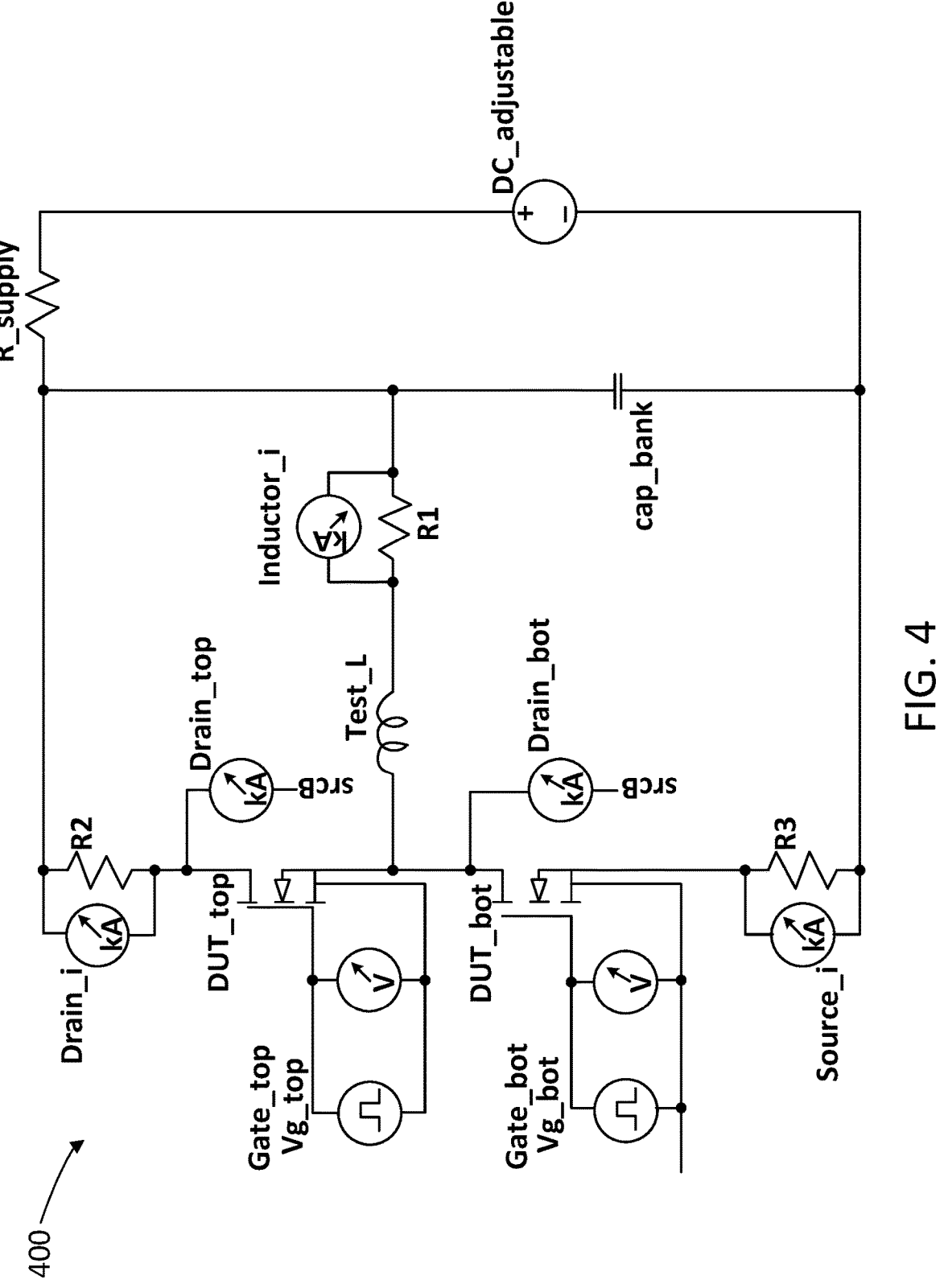
FIG. 4 shows an embodiment of a characterization circuit for characterizing parameters of one or more DUTs in conjunction with the test and measurement system of FIG. 3, according to embodiments of the disclosure.

FIG. 4 also shows a number of measurement points or channels in the characterization circuit 400 at which the power device 50 detects or senses electrical parameters, namely voltages or currents, of the top and bottom devices DUT_top, DUT_bot during testing and characterization of these devices DUT_top, DUT_bot. Each measurement channel is indicated with an angled arrow and an associated descriptor indicating the parameter being sensed at that measurement channel. For example, the characterization circuit 400 includes a first current sense resistor R1 coupled in series with test inductor Test_L and second and third current sense resistors R2, R3 coupled in series with the top and bottom devices DUT_top, DUT_bot as shown. A measurement channel detects a current through the resistor R1, which corresponds to current Inductor_i through the test inductor Test_L. Another measurement channel detects current through resistor R2, which corresponds to drain current Drain_i into top device DUT_top. A third measurement channel detects current through resistor R3 that corresponds to source current Source_i through bottom device DUT_bot.

The characterization circuit 400 includes additional measurement channels for detecting voltages and currents at various points in the characterization circuit, with all the measurement channels enabling the power device 50 to capture operational data for the top and bottom devices DUT_top, DUT_bot and utilize this captured operational data to perform characterization of one or both of the top and bottom devices DUT_top, DUT_bot. Similar measurement channels are shown in the schematic diagrams of FIGS. 5-8 and will not be discussed in more detail in relation to these figures as the function of these test points or channels will be understood from the above description of measurement channels in relation to FIG. 4.

Figure 5:
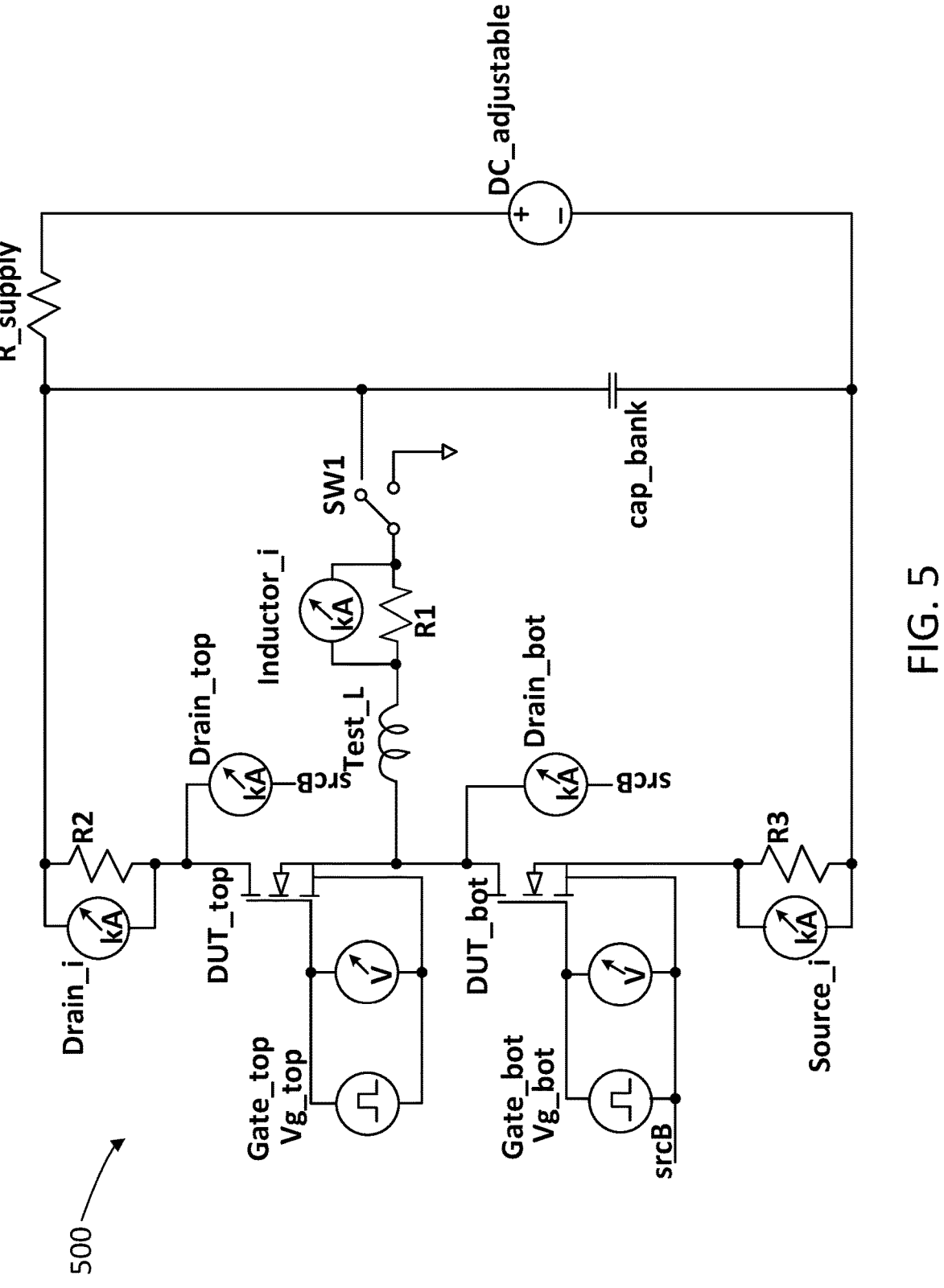
FIG. 5 shows an embodiment of a characterization circuit including a selection switch for independently characterizing parameters of two DUTs in conjunction with the test and measurement system of FIG. 3, according to embodiments of the disclosure.

FIG. 5 shows an embodiment of a characterization circuit 500 including a half bridge switching circuit formed by a top device DUT_top and bottom device DUT_bot, and that includes a switch SW1 used to allow selection between the top and bottom devices DUT_top, DUT_bot. The selection may come into the power device 50 (FIG. 3) through user interface 44 on the measurement device 40 of FIG. 3, with the selection being passed to the power device through direct connection 48. With the addition of switch, SW1, if both the top and bottom devices DUT_top and DUT_bot are installed, both DUT_top and DUT_bot can be characterized in static and dynamic configurations. The configuration of the characterization circuit 500 shown in FIG. 5 shows the selection of the bottom device DUT_bot for testing or characterization. In operation, the user selects static or dynamic characterization, as well as the selection of one of the top and bottom devices DUT_top, DUT_bot through the user interface 44 on the measurement device 40 in the test and measurement system 300 of FIG. 3. The one or more processors 46 of the measurement device 40 then sends the selections and any other parameters to the power device 50. The one or more processors 52 in the power device 50 will then provide signals to the switching circuit 60 to appropriately set switch SW1.

Embodiments of test and measurement systems according to the disclosure include one or both of the characterization circuits 400, 500 of FIGS. 4 and 5 and provide the ability to combine static and dynamic measurements without the need to use multiple setups and instruments, or even the need to re-cable a particular configuration. The test and measurement systems output desired characterization data for DUTs being tested or characterized. This data may be produced on the user interface 44 of the measurement device 40, and/or may be output to a file for further analysis such as a file for an analysis software package. This may be accomplished by the one or more processors 46, 52 in either the power device 50 or the measurement device 40.

Embodiments of the present disclosure are directed to characterization circuits for test and measurement systems that eliminate the need for conventional bias tees to perform static and dynamic characterization of DUTs. As described in more detail below, the solid-state bias tee includes a DUT and a gate drive voltage generator that provides a DC pulse signal and an AC signal to the gate of the DUT to cause this DUT to provide required current and voltage signals to another DUT that is being characterized. The characterization circuit operates in different modes, which enables the functionality of the DUT in the solid-state bias tee and a DUT being characterized to be reversed and, in this way, enable dynamic and static characterization of both DUTs without the use of conventional bias tees. Eliminating the need for conventional bias tees is advantageous as such conventional bias tees must be designed for specific voltage and frequency ranges and typically include discrete inductive, capacitive, and resistive components, which complicates integration of the conventional bias tees into a dynamic characterization platform. Conventional bias tees also have current and frequency limitations that limit the impedance measurements that may be performed on the DUT being characterized. Further embodiments of the disclosure are directed to characterization circuits coupled to first and second DUTs that can generate, at the same time, the gate charge characterization parameters for one the DUTs and body diode characterization of the other DUT.

Figure 6:
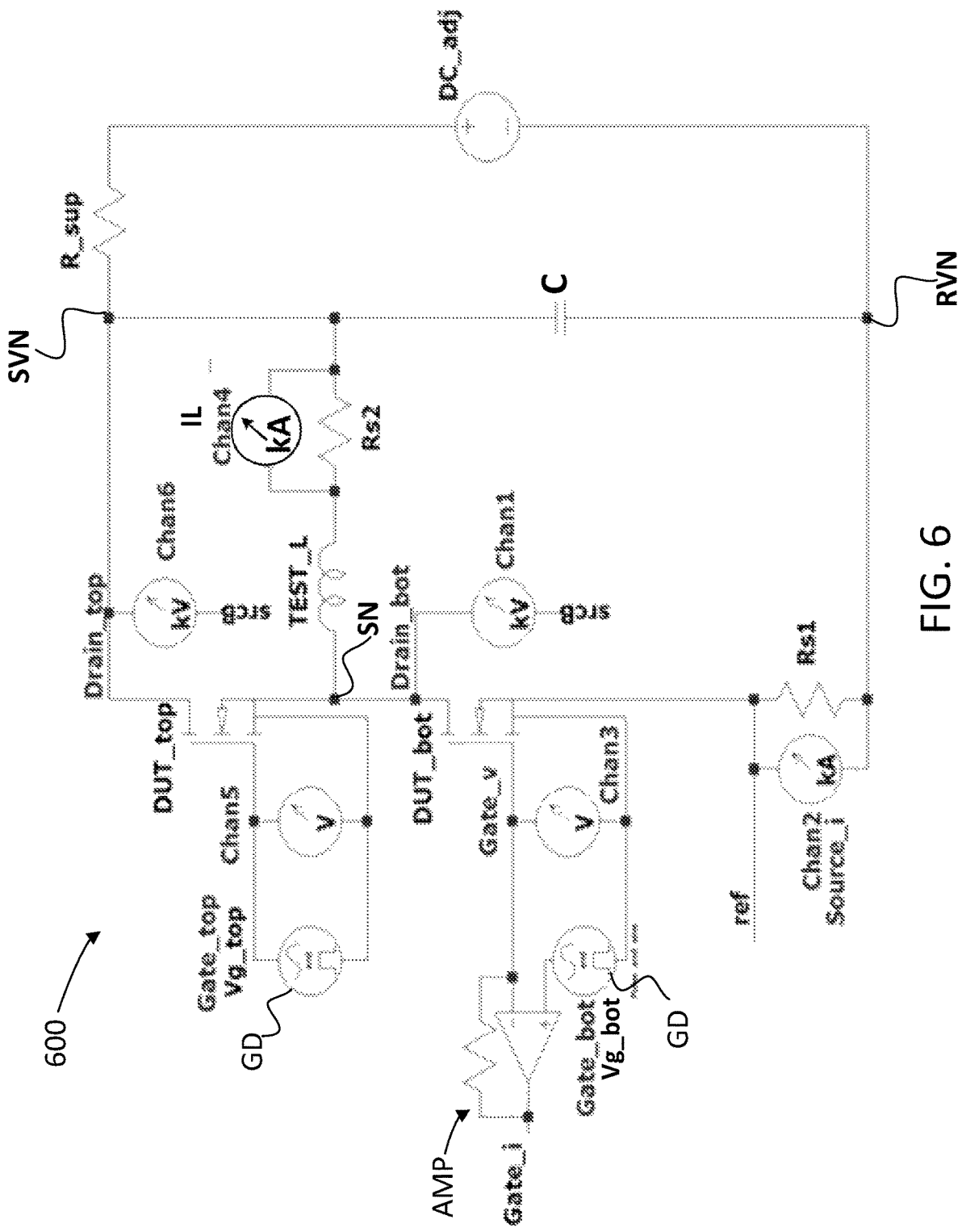
FIG. 6 is a schematic diagram of an example characterization circuit for static and dynamic characterization of one or more DUTs in conjunction with the test and measurement system of FIG. 3, according to embodiments of the disclosure.

FIG. 6 is a schematic diagram of an example characterization circuit 600 for static and dynamic characterization of one or more DUTs DUT_top, DUT_bot in conjunction with the test and measurement system 300 of FIG. 3 according to embodiments of the disclosure. The characterization circuit 600 enables both static and dynamic characterization of the DUTs DUT_top and DUT_bot, which may once again be referred to as top device DUT_top and bottom device DUT_bot with reference to FIG. 6 as well as with reference to DUTs in FIGS. 7 and 8 in the following description. Each of the top and bottom devices DUT_top, DUT_bot is an N-channel MOSFET in the example embodiment of FIG. 6. Further embodiments may include other types of power transistors. Each DUT will be described as including a drain, source, and gate node, which applies to embodiments where each DUT is a MOSFET, but these nodes are intended to apply to equivalent nodes associated with different types of transistors as well.

In the characterization circuit 600 FIG. 6, the top device DUT_top and bottom device DUT_bot form a half bridge circuit coupled in series with a current sense resistor RS1 between a supply voltage node SVN and a reference voltage node RVN. An adjustable DC supply voltage source DC_adj having a supply resistance R_sup is coupled across the voltage nodes SVN, RVN to supply a desired DC voltage across these nodes. A capacitor C, which may include one or more capacitors, filters noise across the voltage nodes SVN, RVN.

A switching node SN is defined at the interconnection between the source and drain of the top and bottom devices DUT_top, DUT_bot and a test inductor TEST_L is coupled in series with a current sense resistance RS2 between the switching node SN and the supply voltage node SVN. The test inductor TEST_L enables the characterization circuit 600 to provide, through one of the top and bottom devices DUT_top, DUT_bot acting as a source element, a desired current through or voltage across the other one of the top and bottom devices DUT_top, DUT_bot as part of dynamically characterizing the other one of the top and bottom devices DUT_top, DUT_bot. The one of the top and bottom devices DUT_top, DUT_bot being characterized may also be referred to as a measured element in the present description. A gate drive voltage generator GD operates in combination with an amplifier AMP to supply a gate drive signal including a DC pulse and AC signal to the bottom device DUT_bot, and to detect a gate current of the bottom device DUT_bot as part of measuring a gate-to-source capacitance Cgs of the bottom device DUT_bot.

FIG. 6 shows the configuration of the characterization circuit 600 where the top device DUT_top is functioning as the source element and the bottom device DUT_bot is the measured element (i.e., the device being characterized). The top and bottom devices DUT_top and DUT_bot are controlled so that desired AC and DC voltages are applied to the bottom device DUT_bot to measure desired dynamic and static parameters of the bottom device DUT_bot and thereby characterize the bottom device DUT_bot. Static current and voltage device characterizations of the devices DUT_top, DUT_bot do not need the test inductor Test_L, but the presence of the inductor allows the same characterization circuit 600 to perform both static and dynamic characterizations. In operation, the top device DUT_top is initially turned OFF bottom device DUT_bot is initially turned ON to provide a desired inductor current IL as a desired drain current through the bottom device DUT_bot. The bottom device DUT_bot is turned OFF when the current through the test inductor TEST_L reaches a desired value, and the inductor current IL recirculates through a body diode (not shown) of the top device DUT_top. The gate drive generators GD supply DC and AC signals to the devices DUT_bot, DUT_top that enable static parameters of the bottom device DUT_bot to be measured, as well as dynamic parameters like gate-to-source capacitance Cgs, gate-to-drain capacitance Cgd, and drain-to-source capacitance Cds.

The characterization circuit 600 may characterize each of the top and bottom devices DUT_top, DUT_bot by switching connection of the test inductor TEST_L and switching coupling of the amplifier AMP. To configure the bottom device DUT_bot as the source element and the top device DUT_top as the measured element being characterized, the terminal of the test inductor TEST_L that is coupled to the supply voltage node SVN would instead be coupled to the reference voltage node RVN. In addition, the amplifier AMP would be coupled to the gate of the top device DUT_top in the same way as shown for the bottom device DUT_bot in FIG. 6, or, alternatively, the characterization circuit 600 may include an additional amplifier (not shown) coupled to the gate of the top device DUT_top.

The characterization circuit 600 includes a number of measurement points or channels Chan1-Chan6 at which the power device 50 detects or senses electrical parameters, namely voltages or currents, of the top and bottom devices DUT_top, DUT_bot during testing and characterization of these devices. Through sensing parameters at the measurement channels Chan1-Chan6 the power device 50 captures operational data for the one of the top and bottom devices DUT_top, DUT_bot that is being characterized. The power device 50 utilizes this captured operational data to characterize the corresponding device DUT_top, DUT_bot. The first measurement channel Chan1 senses a drain voltage Drain_bot of the bottom device DUT_bot relative to a reference voltage node srcB. A drain current through the bottom device DUT_bot is sensed through measurement point Chan2 while a gate-to-source voltage Vgs of the bottom device DUT_bot is sensed at measurement channel Chan3. The measurement channel Chan4 measures an inductor current IL through the test inductor TEST_L, test channel Chan5 measures the gate-to-source voltage Vgs of the top device DUT_top, and test channel Chan6 measures the drain voltage Drain_top of the top device DUT_top.

In the characterization circuit 600, one of the devices DUT_top, DUT_bot may be configured to realize the equivalent operation of a source bias tee during double pulse testing. Double pulse testing is a testing methodology that measures dynamic characteristics, such as switching parameters, of power switching elements like power FETs. The top device DUT_top is the source element and functions as the equivalent of a source bias tee in the configuration of FIG. 6. In this configuration, the top device DUT_top provides required DC voltages as well as a necessary AC signal to properly stimulate the measured element, which in this situation is the bottom device DUT_bot being characterized.

The embodiment of FIG. 6 shows the configuration for current mode drive of the top device DUT_top through modulation of the gate-to-source voltage Vgs of this device. In this way, the top device DUT_top functions as the source element for characterization of the bottom device DUT_bot. Due to the squared relationship between the gate-to-source voltage Vgs and the drain current ID of the top device DUT_top where the top device DUT_top is an FET (i.e., $ID=f(Vgs^2)$), the AC signal component provided by the gate drive voltage generator GD is generally provided at half the desired measurement frequency. A drain current ID at twice the frequency of the AC signal component applied on the gate results due to the frequency doubling resulting from this squaring of the AC signal component. This AC signal component generates an AC signal superimposed on a DC bias current (i.e., drain current ID through device DUT_bot). Impedance measurements of the bottom device DUT_bot to determine the gate-to-source capacitance Cgs and drain-to-source capacitance Cds are made by vector division of an imposed AC voltage provided by the top device DUT_top on the drain (Drain_bot) of the bottom device DUT_bot as measured by channel Chan1, and measuring AC current Gate_i of the bottom device DUT_bot as provided by the amplifier AMP as well as the source current (Source_i) of the bottom device DUT_bot as measured at channel Chan2.

In the characterization circuit 600, the top device DUT_top may be utilized as a controlled current source for characterization of the bottom device DUT_bot at a specified drain current ID through the bottom device DUT_bot. In addition, the top device DUT_top may be utilized to set a specified voltage on drain (Chan1) of the bottom device DUT_bot. In embodiments of the characterization circuit 600, the use of the top device DUT_top as a controlled current source or to set a specified drain voltage may be controlled in a swept or pulsed mode manner to measure characteristics of the bottom device DUT_bot over a wide range of specified parameters. The value of the current or voltage being controlled may be swept or varied over a range of values and pulsed in instances where applying a DC signal at the desired value could destroy or damage the bottom device DUT_bot being characterized.

The gate drive voltage generators GD driving the gates of the top and bottom devices DUT_top, DUT_bot provide the characterization circuit 600 the capability to enable characterization of both the top and bottom devices DUT_top, DUT_bot. Moreover, the capability of measuring gate and source currents of each of the top and bottom devices DUT_top, DUT_bot relative to AC signals applied across the drain of the bottom device DUT_bot (i.e., of the DUT being characterized) enables measurement of all impedances associated with the bottom device DUT_bot. These measurement capabilities and the capability of switching the source and measuring elements the characterization circuit 600 to fully characterize each of the top and bottom devices DUT_top, DUT_bot.

Figure 7:
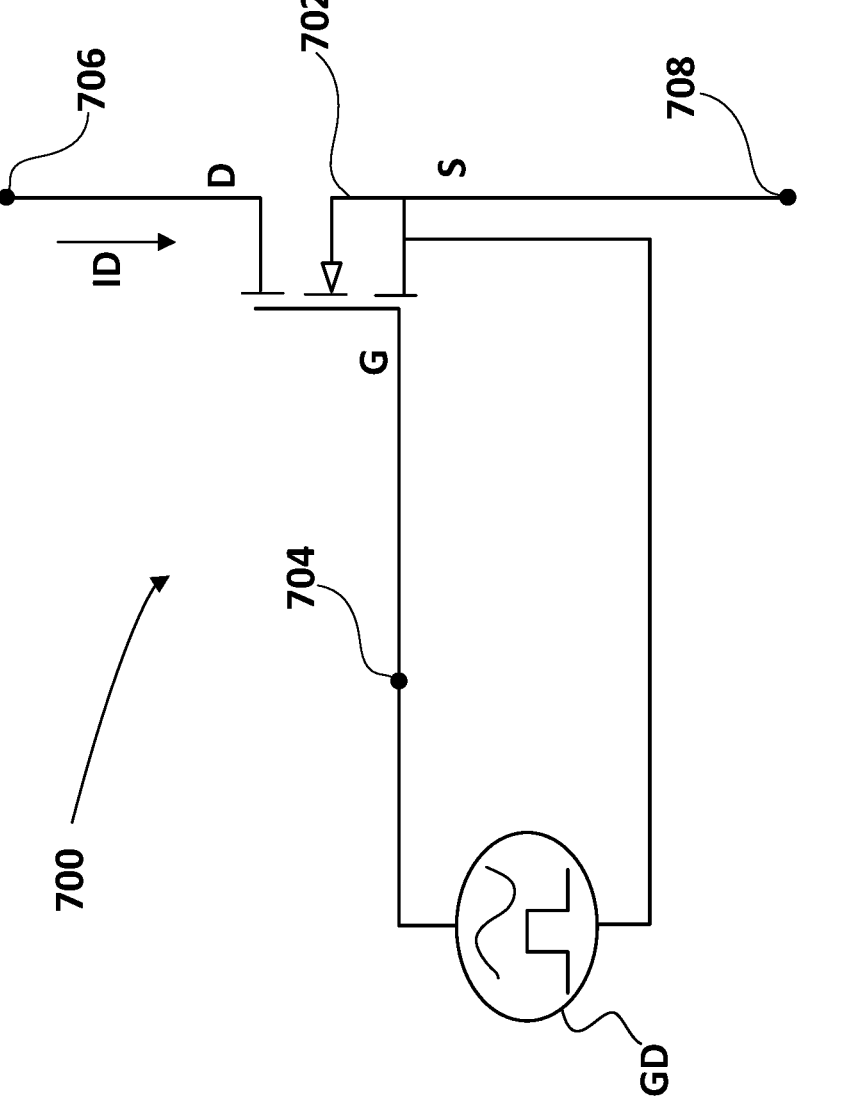
FIG. 7 is a schematic of a solid-state bias tee that may be utilized in the characterization circuits of FIGS. 6, 8 and 9, according to embodiments of the disclosure.
Figure 8:
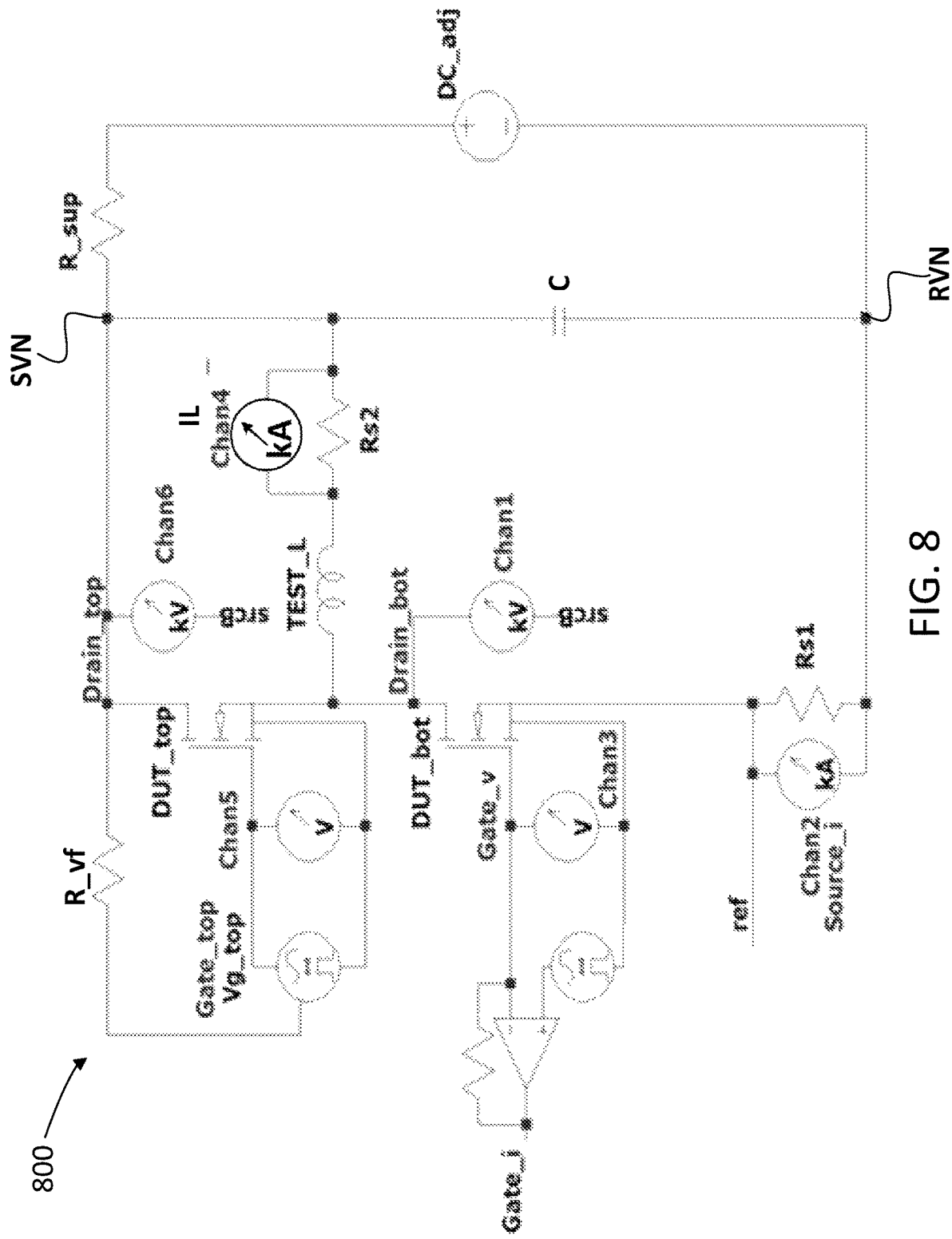
FIG. 8 is a schematic diagram of another example characterization circuit for static and dynamic characterization of one or more DUTs in conjunction with the test and measurement system of FIG. 3, according to embodiments of the disclosure.
Figure 9:
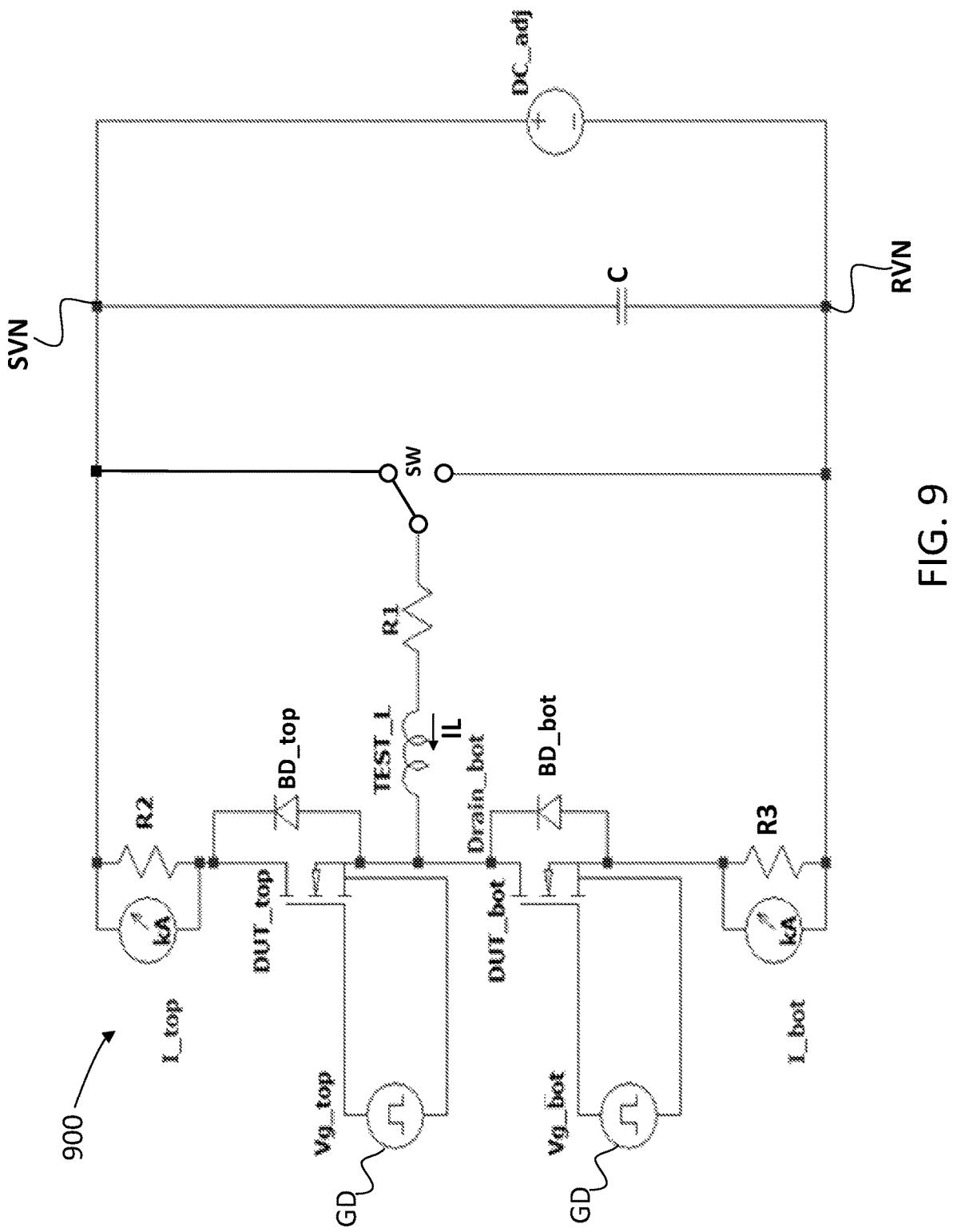
FIG. 9 is a schematic diagram of an example characterization circuit for gate charge characterization and body diode characterization of one or more DUTs in conjunction with the test and measurement system of FIG. 3, according to embodiments of the disclosure.

FIG. 7 is a schematic of a solid-state bias tee 700 that may be utilized in the characterization circuits 600, 800, and 900 of FIGS. 6, 8 and 9 according to embodiments of the disclosure. The solid-state bias tee 700 may be utilized in other characterization circuits, including those that are not configured to perform double pulse testing, as well as the characterization circuits 600, 800 and 900. The solid-state bias tee 700 includes an FET 702 and a gate drive voltage generator GD that provides a DC pulse signal and an AC signal to the gate of the FET 702. The FET is an N-channel FET in the example embodiment of FIG. 7, but may be other types of transistors in further embodiments. The bias tee 700 includes a first node 704, second node 706, and third node 708 coupled to the gate, drain, and source, respectively, of the FET 702. In operation, the gate drive voltage generator GD supplies a drive signal on the first node 704 including suitable AC and DC pulse components to control the FET 702 function as a controlled current source to provide a desired drain current ID or to set a specified voltage on the source of the FET 702. In this way, the gate drive voltage generator GD and FET 702 function as a bias tee to provide a desired voltage or current having desired AC and DC components at the source S of the FET 702. In the example embodiment of FIG. 6, the gate drive voltage generator GD and top device DUT_top correspond to an example implementation of the bias tee 700 of FIG. 7.

FIG. 8 is a schematic diagram of another example characterization circuit 800 for static and dynamic characterization of one or more DUTs in conjunction with the test and measurement system 300 of FIG. 3, according to embodiments of the disclosure. Components in the characterization circuit 800 that are the same as the corresponding components in the characterization circuit 600 of FIG. 6. In contrast to the characterization circuit 600, the characterization circuit 800 includes voltage feedback from the drain Drain_top through a voltage feedback resistor R_vf to control the gate drive voltage generator GD driving the gate of the top device DUT_top, with the top device DUT_top functioning as the source element in the illustrated example embodiment. In the characterization circuit 800, the frequency of the modulating or AC signal provided by the gate drive voltage generator GD is the same as the desired frequency of the drain current ID supplied to the bottom device DUT_bot being characterized.

Both the characterization circuits 600, 800 can be utilized to measure capacitances Cgd and Cds. To measure the gate-to-source capacitance Cgs, the gate drive voltage generator GD provides a proper DC bias signal to the gate of the bottom device DUT_bot as well as a desired AC stimulus signal, with the impedance being measured using the resulting gate current Gate_i sensed by amplifier AMP and gate voltage measurements at channel Chan3.

FIG. 9 is a schematic diagram of an example characterization circuit 900 for gate charge characterization and body diode characterization of one or more DUTs in conjunction with the test and measurement system 300 of FIG. 3, according to embodiments of the disclosure. Conventional approaches for measuring the gate charge curve of an FET involve a source measurement unit (SMU) or other equivalent device that supplies a constant current to the gate of the FET and measures the resulting gate-to-source voltage Vgs over time. In addition, an SMU or equivalent device supplies a desired drain voltage and drain current to the FET at the same time. This approach requires dedicated equipment in the form of the SMUs to generate the gate charge curve and provide static characterization of the FET.

The characterization circuit 900 enables gate charge curve characterization of each of a top device DUT_top and bottom device DUT_bot without recabling connections between each device and external test equipment. The top and bottom devices DUT_top, DUT_bot are coupled in series with a switching node SN defined at the interconnection of the two. A test inductor TEST_L is coupled is series with a first current sense resistor R1 between a switch SW and the switching node SN. An adjustable DC supply voltage source DC_adj is coupled across the voltage nodes SVN, RVN to supply a desired DC voltage across these nodes and a capacitor C filters noise across the voltage nodes. To measure a current I_top, I_bot through the top and bottom devices DUT_top, DUT_bot, respectively, a second current resistor R2 is coupled between the supply voltage node SVN and the drain of the top device DUT_top and a third current sense resistor R3 is coupled between the source of the bottom device DUT_bot and the reference voltage node RVN. In FIG. 9, the switch SW is shown in the position making the bottom device DUT_bot the measured element or the device being characterized and the top device DUT_top the source element.

In operation of the characterization circuit 900, the gate charge characteristic of the bottom device DUT_bot may be determined using the following process. First, the supply DC_adj is set to a desired starting DC voltage level for the drain-to-source test voltage for the bottom device DUT_bot. Initially, both the top and bottom devices DUT_top DUT_bot are turned OFF. The bottom device DUT_bot is then turned ON for a duration of time to allow a desired inductor current IL to flow through test inductor TEST_L. The current IL through the inductor TEST_L may be calculated (di/dt=V/L) or continuously measured, with the determination then being based on either expiration of a specific time or the measured inductor current reaching a desired current threshold.

Upon the inductor current IL reaching the desired current threshold, the bottom device DUT_bot is turned OFF. At this point, inductor current IL will continue to flow through the inductor TEST_L and will also flow through the body diode BD_top of the top device DUT_top. The top device DUT_top may be turned ON at this point to reduce decay of the current IL due to losses in the body diode BD_top. A delay time is then waited to ensure the bottom device DUT_bot is sufficiently turned OFF. If the top device DUT_top is turned ON, the top device DUT_top is turned ON and then a delay time is waited to ensure before the bottom device DUT_bot is again turned ON.

At this point, the gate drive voltage generator GD provides an initial desired voltage Vg_bot on the gate of the bottom device DUT_bot. This initial voltage is typically zero voltage, but other levels might be desired. The gate drive voltage generator GD then supplies a constant current to the gate of the bottom device DUT_bot. In an embodiment, the constant current source of the gate drive voltage generator GD may be substituted with a voltage source in series with a resistor. The voltage Vg_bot at the gate of the bottom device DUT_bot is then continuously measured, or sampled, over time.

The measured gate voltage Vg_bot and the current, or a calculated current if the gate drive voltage generator GD includes a voltage source with a resistor, to obtain a full gate charge characteristic of the bottom device DUT_bot for the set drain current and starting drain voltage Drain_bot. This entire process may then be repeated, if desired, at different drain-to-source VDS voltages for the bottom device DUT_bot and at different desired levels or values of drain current ID through the bottom device DUT_bot. This process will provide gate charge parameters for the bottom device DUT_bot at different current and voltage levels. To obtain these same gate charge parameters for the top device DUT_top, the switch SW is switched to the bottom position so that the associated terminal of the test inductor TEST_L is connected to the reference voltage node RVN instead of the supply voltage node SVN. Now, if the operation of the top and bottom devices DUT_top, DUT_bot is reversed or switched from that described above, the gate charge curve characteristics of the top device DUT_top may be measured. This operation of the characterization circuit 900 to characterize gate charge parameters of both the top and bottom devices DUT_top, DUT_bot assumes that gate control and measurement capabilities of the characterization circuit is the same for is same on both the top and bottom devices DUT_top, DUT_bot.

In addition to gate charge curve parameters of the top and bottom devices DUT_top, DUT_bot, the characterization circuit 900 enables measurement of dynamic characteristics of the body diodes BD_top, BD_bot of the top and bottom devices DUT_top, DUT_bot. These body diode parameters are typically measured through double pulse testing. The characterization circuit 900 can measure body diode parameters through the following process. Initially, the adjustable DC supply voltage source DC_adj is set to a desired starting DC voltage level and both the top and bottom devices DUT_top, DUT_bot are turned OFF. The bottom device DUT_bot is then turned ON for a period of time to reach a desired current threshold for the current IL through the inductor TEST_L. As previously described, the value of the current IL may be calculated based on the time the bottom device DUT_bot is turned ON, or may be continuously measured.

Once the current IL through the inductor TEST_L reaches the desired threshold, the bottom device DUT_bot is turned OFF. At this point, the inductor current IL will now flow through the body diode BD_top of the top device DUT_top. During this time, the current and voltage parameters of the body diode BD_top can be extracted during quiescent sections of the current through the body diode as well as dynamic parameters during transitions of this current. The bottom device DUT_bot is thereafter turned ON, and a delay time provide to adjust inductor current IL to the next desired value or level, with the bottom device DUT_bot thereafter being turned OFF and the body diode parameters of the body diode BD_top once again measured at the new level of the inductor current. This process is then repeated at different DC voltage levels provided by the adjustable DC supply voltage source DC_adj, with the turn ON timing of the bottom device DUT_bot being adjusted accordingly account for variation in the rate of change of the inductor current IL through the inductor IL, or measuring this current directly until a threshold is reached. The entire process may be repeated at different gate-to-source voltages Vgs supplied to the gate drive voltage generator GD coupled to the top device DUT_top.

Through the process described above, the characterization circuit 900 extracts or measures the body diode parameters of the body diode BD_top of the top device DUT_top. This process may be performed when the configuration of the switch SW is set in the first position shown in FIG. 9. To extract or measure the same parameters for the body diode BD_bot of the bottom device DUT_bot, the switch SW need merely be set to the second position, namely coupling the associated terminal of the inductor TEST_L to the reference voltage node RVN instead of the supply voltage node SVN. Once the switch SW is set to the second position, the control and measurement of the top and bottom devices DUT_top, DUT_bot described above to extract or measure parameters of the body diode BD_bot of the bottom device DUT_bot.

The characterization circuit 900 eliminates the need for a negative supply voltage source to perform complete body diode characterization for both the top and bottom devices DUT_top, DUT_bot. Moreover, in embodiments of the characterization circuit 900 the body diode parameters of one of the top and bottom devices DUT_top, DUT_bot may be measured while the gate charge curve parameters of the other device are being measured. For example, while the gate charge curve characteristics of the bottom device DUT_bot are being measured as described above, the characteristics of the body diode BD_top of the top device DUT_top may be measured during the portions of the gate charge curve characterization process when the bottom device DUT_bot is turned OFF. This extraction of parameters occurs at the same time or simultaneously during operation of the characterization circuit 900, which reduces the time required to characterize the gate charge curve for one of the devices DUT_top, DUT_bot and the body diode character-istics of the other device DUT_bot, DUT_top.

In the embodiment of FIG. 9, the top and bottom DUTs DUT_top, DUT_bot are shown as being MOSFETs that each include a corresponding body diode BD. Embodiments of the characterization circuit 900 are not, however, limited to characterizing MOSFETs or other types of FETs including body diodes such as SiC MOSFETs. More generally, the characterization circuit 900 may characterize a reverse cur-rent path in FETs that do not include a body diode, such as Gallium Nitride (GaN) FETs. In embodiments of the char-acterization circuit 900 where the top and bottom DUTs DUT_top, DUT_bot are FETs that do not include a body diode BD, such as GaN FETs, the characterization circuit would operate as described above except, when a reverse conduction condition of the one of the top and bottom GaN FETs being characterized is to be measured, the character-ization circuit 900 would apply a desired gate voltage on the GaN FET being characterized. This desired gate voltage would be applied during the time when the inductor current IL would be expected to circulate as a reverse current through the GaN FET being characterized.

Aspects of the disclosure may operate on a particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedi-cated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, com-ponents, data structures, etc. that perform particular tasks or implement particular abstract data types when executed by a processor in a computer or other device. The computer executable instructions may be stored on a non-transitory computer readable medium such as a hard disk, optical disk, removable storage media, solid-state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibili-ties.

EXAMPLES

Illustrative examples of the disclosed technologies are provided below. An embodiment of the technologies may include one or more, and any combination of, the examples described below.

Example 1 is a test and measurement device including a test and measurement system, including: a device under test (DUT) interface structured to couple to first and second DUTs that are coupled to form a half bridge circuit; and a characterization circuit structured to be controlled to per-form static testing and dynamic testing of the first and second DUTs, the characterization circuit including: a solid-state bias tee including: the first DUT; and a first drive voltage generator to provide a DC pulse signal and AC signal on a gate node of the first DUT to cause the first DUT to supply current and voltage signals to the second DUT for static and dynamic characterization of the second DUT.

Example 2 is the test and measurement system of Example 1, wherein the first and second DUTs comprise a first MOSFET and a second MOSFET, respectively.

Example 3 is the test and measurement system of Example 2, wherein the solid-state bias tee is controlled to function as a controlled current source to provide a desired current for characterization of the second MOSFET.

Example 4 is the test and measurement system of Example 4, wherein the solid-state bias tee is configured to provide an AC voltage signal having a first frequency on a gate of the first MOSFET, the first frequency having a value that is equal to one half of a second frequency of a drain current to be generated by the first MOSFET in response to the AC voltage signal.

Example 5 is the test and measurement system of Example 2, wherein the solid-state bias tee is controlled to provide a desired voltage on a drain of the second MOSFET.

Example 6 is the test and measurement system of Example 2, further comprising an amplifier coupled to a gate of the second MOSFET to sense a gate current of the second MOSFET for use in determining a gate-to-source capacitance of the second MOSFET.

Example 7 is the test and measurement system of Example 2, wherein the first and second MOSFET are coupled in series with a resistance between a supply voltage node and a reference voltage node, the resistance coupled between a source of the second MOSFET and the reference voltage node to sense a source current through the second MOSFET.

Example 8 is the test and measurement system of Example 1, further comprising a test inductor coupled in series with a resistance between a switching node of the half bridge circuit and a supply voltage node.

Example 9 is the test and measurement system of Example 8, further comprising a plurality of measurement channels to measure a gate-to-source voltage of each of the first and second MOSFETs, a voltage across the resistance to measure current through the second MOSFET, voltages on drains of the first and second MOSFET, and current through the test inductor.

Example 10 is the test and measurement system of claim 1, further comprising a second drive voltage generator to provide a DC pulse signal and AC signal on a gate node of the second DUT.

Example 11 is a test and measurement system, including: a device under test (DUT) interface structured to couple to top and bottom FETs that are coupled to form a half bridge circuit, each FET including a reverse current path; and a characterization circuit structured to be controlled to perform gate charge curve testing of the top and bottom FETs, the characterization circuit including: a test inductor coupled between a switching node of the half bridge circuit and a voltage node; and top and bottom gate drive circuits configured to supply respective gate drive signals to gates of the top and bottom FETs, the bottom gate drive circuit configured to turn ON the one of the top and bottom FETs being characterized until a current through the inductor reaches a threshold value and to thereafter turn OFF the one of the FETs being characterized, and the gate drive circuit of the one of the FETs being characterized configured to then provide a constant current to the gate of the one of the FETs being characterized and the characterization circuit configured to measure the voltage on the gate of the one of the FETs being characterized to measure gate charge characteristics.

Example 12 is the test and measurement system of Example 11, further comprising a switch configured to selectively couple the voltage node to a supply voltage node when the bottom FET is the one of the FETs being characterized and to couple the voltage node to a reference voltage node when the top FET is the one of the FETs being characterized.

Example 13 is the test and measurement system of Example 12, further comprising a top current sense resistance coupled between the supply voltage node and a drain of the top FET and a bottom current sense resistance coupled between the reference voltage node and a source of the bottom FET, the characterization circuit configured to sense drain current of the top FET and source of the bottom FET based on voltages across the top and bottom sense resistances.

Example 14 is the test and measurement system of Example 11, wherein, in response to the one of the FETs being characterized being turned OFF, the current through the inductor flows through the reverse current path of the other one of the FETs and the characterization circuit is further configured to measure voltages and currents of the other one of the FETs and enable characterization of the reverse current path of the other one of the FETs.

Example 15 is the test and measurement system of Example 14, wherein the characterization circuit is configured to determine the current through the inductor has reached the threshold based on either time the one of the FETs being characterized has been turned ON or based on direct measurements indicating the value of the current through the inductor.

Example 16 is the test and measurement system of Example 11, wherein an inductor current sense resistance is coupled in series with the inductor to enable the characterization circuit to measure current through the inductor based on a voltage drop across the inductor current sense resistance.

Example 17 is a test and measurement system, including: a device under test (DUT) interface structured to couple to top and bottom FETs that are coupled to form a half bridge circuit, each FET including a reverse current path; and a characterization circuit structured to be controlled to perform reverse current path characterization of the top and bottom FETs, the characterization circuit including: a test inductor coupled between a switching node of the half bridge circuit and a voltage node; and top and bottom gate drive circuits configured to supply respective gate drive signals to gates of the top and bottom FETs, the bottom gate drive circuit configured to turn ON one of the top and bottom FETs until a current through the inductor reaches a threshold value and to thereafter turn OFF the one of the FETs that was turned ON, the turning OFF causing the inductor current to flow through the reverse current path of the other FET being characterized, the characterization circuit configured to measure voltage and current parameters of the FET being characterized to determine reverse current path characteristics of the FET being characterized.

Example 18 is the test and measurement system of Example 17, wherein the characterization circuit is configured to set a plurality of different thresholds for the inductor current in characterizing the reverse current paths of the top and bottom FETs.

Example 19 is the test and measurement system of Example 17, further comprising a switch configured to selectively couple the voltage node to a supply voltage node when the reverse current path of the top FET is being characterized and to couple the voltage node to a reference voltage node when the reverse current path of the bottom FET is being characterized.

Example 20 is the test and measurement system of Example 19, wherein each of the top and bottom FETs is one of a MOSFET and a SiC MOSFET and wherein the reverse current path of each of the top and bottom FETs corresponds to a body diode of the FET.

The foregoing description has been set forth merely to illustrate example embodiments of present disclosure and is not intended to be limiting. Since modifications of the disclosed embodiments incorporating the substance of the invention may occur to person skilled in the art, the invention should be construed to include everything within the scope of the invention.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

The invention claimed is:

1. A test and measurement system, comprising:
a device under test (DUT) interface structured to couple to first and second DUTs that are coupled to form a half bridge circuit; and
a characterization circuit structured to be controlled to perform static testing and dynamic testing of the first and second DUTs, the characterization circuit including:
a solid-state bias tee including:
the first DUT; and
a first drive voltage generator to provide a DC pulse signal and AC signal on a gate node of the first DUT to cause the first DUT to supply current and voltage signals to the second DUT for static and dynamic characterization of the second DUT.

2. The test and measurement system of claim 1, wherein the first and second DUTs comprise a first metal-oxide-semiconductor field-effect transistor (MOSFET) and a second MOSFET, respectively.

3. The test and measurement system of claim 2, wherein the solid-state bias tee is configured as a controlled current source to provide a desired current for characterization of the second MOSFET.

4. The test and measurement system of claim 3, wherein the solid-state bias tee is configured to provide an AC voltage signal having a first frequency on a gate of the first MOSFET, the first frequency having a value that is equal to one half of a second frequency of a drain current to be generated by the first MOSFET in response to the AC voltage signal.

5. The test and measurement system of claim 2, wherein the solid-state bias tee is controlled to provide a desired voltage on a drain of the second MOSFET.

6. The test and measurement system of claim 2, further comprising an amplifier coupled to a gate of the second MOSFET to sense a gate current of the second MOSFET for use in determining a gate-to-source capacitance of the second MOSFET.

7. The test and measurement system of claim 2, wherein the first and second MOSFET are coupled in series with a resistance between a supply voltage node and a reference voltage node, the resistance coupled between a source of the second MOSFET and the reference voltage node to sense a source current through the second MOSFET.

8. The test and measurement system of claim 1, further comprising a test inductor coupled in series with a resistance between a switching node of the half bridge circuit and a supply voltage node.

9. The test and measurement system of claim 8, further comprising a plurality of measurement channels to measure a gate-to-source voltage of each of the first and second MOSFETs, a voltage across the resistance to measure current through the second MOSFET, voltages on drains of the first and second MOSFET, and current through the test inductor.

10. The test and measurement system of claim 1, further comprising a second drive voltage generator to provide a DC pulse signal and AC signal on a gate node of the second DUT.

11. A test and measurement system, comprising:
a device under test (DUT) interface structured to couple to top and bottom field-effect transistors (FETs) that are coupled to form a half bridge circuit, each FET including a reverse current path; and
a characterization circuit structured to be controlled to perform gate charge curve testing of the top and bottom FETs, the characterization circuit including:
a test inductor coupled between a switching node of the half bridge circuit and a voltage node; and
top and bottom gate drive circuits configured to supply respective gate drive signals to gates of the top and bottom FETs, the top or bottom gate drive circuit configured to turn ON the one of the top and bottom FETs being characterized until a current through the inductor reaches a threshold value and to thereafter turn OFF the one of the top and bottom FETs being characterized, and the gate drive circuit of the one of the top and bottom FETs being characterized configured to then provide a constant current to the gate of the one of the top and bottom FETs being characterized and the characterization circuit configured to measure the voltage on the gate of the one of the top and bottom FETs being characterized to measure gate charge characteristics.

12. The test and measurement system of claim 11, further comprising a switch configured to selectively couple the voltage node to a supply voltage node when the bottom FET is the one of the top and bottom FETs being characterized and to couple the voltage node to a reference voltage node when the top FET is the one of the top and bottom FETs being characterized.

13. The test and measurement system of claim 12, further comprising a top current sense resistance coupled between the supply voltage node and a drain of the top FET and a bottom current sense resistance coupled between the reference voltage node and a source of the bottom FET, the characterization circuit configured to sense drain current of the top FET and source current of the bottom FET based on voltages across the top and bottom current sense resistances.

14. The test and measurement system of claim 11, wherein, in response to the one of the FETs being characterized being turned OFF, the current through the inductor flows through the reverse current path of the other one of the top and bottom FETs and the characterization circuit is further configured to measure voltages and currents of the other one of the top and bottom FETs and enable characterization of the reverse current path of the other one of the top and bottom FETs.

15. The test and measurement system of claim 14, wherein the characterization circuit is configured to determine the current through the inductor has reached the threshold based on either time the one of the FETs being characterized has been turned ON or based on direct measurements indicating the value of the current through the inductor.

16. The test and measurement system of claim 11, wherein the reverse current path comprises a body diode of each of the top and bottom FETs.

17. A test and measurement system, comprising:

a device under test (DUT) interface structured to couple to top and bottom field-effect transistors (FETs) that are coupled to form a half bridge circuit, each FET including a reverse current path; and a characterization circuit structured to be controlled to perform reverse current path characterization of the top and bottom FETs, the characterization circuit including:

a test inductor coupled between a switching node of the half bridge circuit and a voltage node; and top and bottom gate drive circuits configured to supply respective gate drive signals to gates of the top and bottom FETs, the bottom or top gate drive circuit configured to turn ON one of the top and bottom FETs until a current through the inductor reaches a threshold value and to thereafter turn OFF the one of the FETs that was turned ON, the turning OFF causing the inductor current to flow through the reverse current path of the other FET being characterized, the characterization circuit configured to measure voltage and current parameters of the FET being characterized to determine reverse current path characteristics of the FET being characterized.

18. The test and measurement system of claim 17, wherein the characterization circuit is configured to set a plurality of different thresholds for the inductor current in characterizing the reverse current paths of the top and bottom FETs.

19. The test and measurement system of claim 17, further comprising a switch configured to selectively couple the voltage node to a supply voltage node when the reverse current path of the top FET is being characterized and to couple the voltage node to a reference voltage node when the reverse current path of the bottom FET is being characterized.

20. The test and measurement system of claim 19, wherein each of the top and bottom FETs is one of a MOSFET and a SiC MOSFET and wherein the reverse current path of each of the top and bottom FETs corresponds to a body diode of the FET.

* * * * *